United States Patent
Yoon et al.

(10) Patent No.: US 9,905,754 B1
(45) Date of Patent: Feb. 27, 2018

(54) METHOD OF FORMING PATTERNS AND METHOD OF MANUFACTURING A SEMICONDUCTOR DEVICE USING THE SAME

(71) Applicant: Samsung Electronics Co., Ltd., Suwon-si (KR)

(72) Inventors: Hye-Ji Yoon, Pyeongtaek-si (KR); Yoo-Chul Kong, Seoul (KR); Jong-Kyu Kim, Seongnam-si (KR); Sang-Kuk Kim, Seongnam-si (KR); Yil-Hyung Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/630,046

(22) Filed: Jun. 22, 2017

(30) Foreign Application Priority Data

Jan. 11, 2017 (KR) .......................... 10-2017-0004250

(51) Int. Cl.
*H01L 43/12* (2006.01)
*H01L 27/22* (2006.01)

(52) U.S. Cl.
CPC ............ *H01L 43/12* (2013.01); *H01L 27/222* (2013.01)

(58) Field of Classification Search
CPC .............................. H01L 43/12; H01L 27/222
See application file for complete search history.

(56) References Cited

U.S. PATENT DOCUMENTS

| | | | |
|---|---|---|---|
| 6,121,158 A * | 9/2000 | Benchikha | G03F 7/40 438/766 |
| 6,933,236 B2 | 8/2005 | Lee et al. | |
| 2006/0246382 A1 | 11/2006 | Lee et al. | |
| 2010/0081092 A1 | 4/2010 | Yun | |
| 2011/0129781 A1 | 6/2011 | Kim et al. | |
| 2012/0280140 A1 * | 11/2012 | Godet | H01J 37/3023 250/424 |
| 2012/0305525 A1 | 12/2012 | Lee et al. | |
| 2016/0064239 A1 * | 3/2016 | Shih | H01L 21/0273 438/694 |

FOREIGN PATENT DOCUMENTS

| | | |
|---|---|---|
| JP | 08031726 | 2/1996 |
| JP | 2008185931 | 8/2008 |
| KR | 100596431 | 7/2006 |

* cited by examiner

*Primary Examiner* — Karen Kusumakar
(74) *Attorney, Agent, or Firm* — Onello & Mello, LLP

(57) ABSTRACT

In a method of forming a pattern of a semiconductor device, a first mask layer and an anti-reflective coating layer may be sequentially formed on a substrate. A photoresist layer may be formed on the anti-reflective coating layer. The photoresist layer may be exposed and developed to form a first preliminary photoresist pattern. A first ion beam etching process may be performed on the first preliminary photoresist pattern to form a second preliminary photoresist pattern. A second ion beam etching process may be performed on the second preliminary photoresist pattern to form a photoresist pattern. A second incident angle of an ion beam in the second ion beam etching process may be greater than a first incident angle of an ion beam in the first ion beam etching process. The anti-reflective coating layer and the first mask layer may be etched using the photoresist pattern as an etching mask to form a mask structure.

20 Claims, 23 Drawing Sheets

METHOD OF FORMING PATTERNS AND METHOD OF MANUFACTURING A SEMICONDUCTOR DEVICE USING THE SAME

CROSS-REFERENCE TO RELATED APPLICATION

This application claims priority under 35 USC § 119 to Korean Patent Application No. 10-2017-0004250, filed on Jan. 11, 2017 in the Korean Intellectual Property Office (KIPO), the contents of which are herein incorporated by reference in their entirety.

BACKGROUND

1. Field

Example embodiments relate to methods of forming patterns of a semiconductor device and methods of manufacturing a semiconductor device using the same.

2. Description of the Related Art

As semiconductor devices become more highly integrated, forming contact holes or patterns having finer sizes becomes more of a challenge. In particular, uniformly forming contact holes or patterns on a substrate becomes more difficult.

SUMMARY

According to example embodiments, there is provided a method of forming a pattern of a semiconductor device. In the method, a first mask layer and an anti-reflective coating layer may be sequentially formed on a substrate. A photoresist layer may be formed on the anti-reflective coating layer. The photoresist layer may be exposed and developed to for a first preliminary photoresist pattern. A first ion beam etching process may be performed on the first preliminary photoresist pattern to form a second preliminary photoresist pattern. An ion beam in the first ion beam etching process may be incident on an upper surface of the substrate at a first incident angle. A second ion beam etching process may be performed on the second preliminary photoresist pattern to form a photoresist pattern. An ion beam in the second ion beam etching process may be incident on the upper surface of the substrate at a second incident angle greater than the first incident angle. The anti-reflective coating layer and the first mask layer may be etched using the photoresist pattern as an etching mask to form a mask structure.

According to example embodiments, there is provided a method of forming a pattern of a semiconductor device. In the method, an etch target layer and a first mask layer may be sequentially formed on a substrate. A photoresist layer may be formed on the first mask layer. The first mask layer may be etched using the first photoresist pattern as an etching mask to form a first preliminary mask pattern. A first ion beam etching process may be performed on the first preliminary mask pattern to form a second preliminary mask pattern, wherein an ion beam in the first ion beam etching process may be incident on an upper surface of the substrate at a first incident angle. A second ion beam etching process may be performed on the second preliminary mask pattern to form a first mask, wherein an ion beam in the second ion beam etching process may be incident on the upper surface of the substrate at a second incident angle greater than the first incident angle. The etch target layer may be etched using the first mask as an etching mask to form a pattern structure.

According to example embodiments, there is provided a method of manufacturing a semiconductor device. In the method, an etch target layer including a magnetic tunnel junction (MTJ) layer may be formed on a substrate. A first mask layer and an anti-reflective coating layer may be sequentially formed on the etch target layer. A first preliminary photoresist pattern may be formed on the anti-reflective coating layer. The first preliminary photoresist pattern may include a plurality of contact holes. A first ion beam etching process may be performed on the first preliminary photoresist pattern to form a second preliminary photoresist pattern. An ion beam in the first ion beam etching process may be incident on an upper surface of the substrate at a first incident angle. A second ion beam etching process may be performed on the second preliminary photoresist pattern to form a photoresist pattern. An ion beam in the second ion beam etching process may be incident on the upper surface of the substrate at a second incident angle greater than the first incident angle. The anti-reflective coating layer and the first mask layer may be etched using the photoresist pattern as an etching mask to form a mask structure. A hard mask having a pillar shape may be formed to fill the contact holes in the mask structure. The mask structure may be removed. The etch target layer may be etched using the hard mask to form a mask structure.

In accordance with example embodiments, in the semiconductor device, the pattern structures having good uniformity may be formed.

In example embodiments in accordance with principles of inventive concepts, a method of manufacturing a semiconductor device, includes forming an etch target layer including a magnetic tunnel junction layer on a substrate, sequentially forming a first mask layer and an anti-reflective coating layer on the etch target layer, forming a first preliminary photoresist pattern on the anti-reflective coating layer, the first preliminary photoresist pattern including a plurality of contact holes, performing a first ion beam etching process, using an ion beam incident at a first incident angle less than ninety degrees with a surface of the substrate, on the first preliminary photoresist pattern to form a second preliminary photoresist pattern, wherein the ion beam etching process smoothes sidewalls of contact holes, and performing a second ion beam etching process, using an ion beam incident at a second incident angle greater than the first incident angle, on the second preliminary photoresist pattern to form a photoresist pattern.

BRIEF DESCRIPTION OF THE DRAWINGS

Example embodiments will be more clearly understood from the following detailed description taken in conjunction with the accompanying drawings.

FIGS. 1 to 8 are cross-sectional views and plan views illustrating stages of a method of forming patterns in accordance with example embodiments;

FIGS. 9 and 10 are plan views illustrating stages of a method of forming patterns in accordance with example embodiments;

FIGS. 11 to 15 are cross-sectional views illustrating stages of a method of forming patterns in accordance with example embodiments; and FIGS. 16 to 23 are cross-sectional views illustrating stages of a method of forming patterns in accordance with example embodiments.

DESCRIPTION OF EMBODIMENTS

Figure 9:
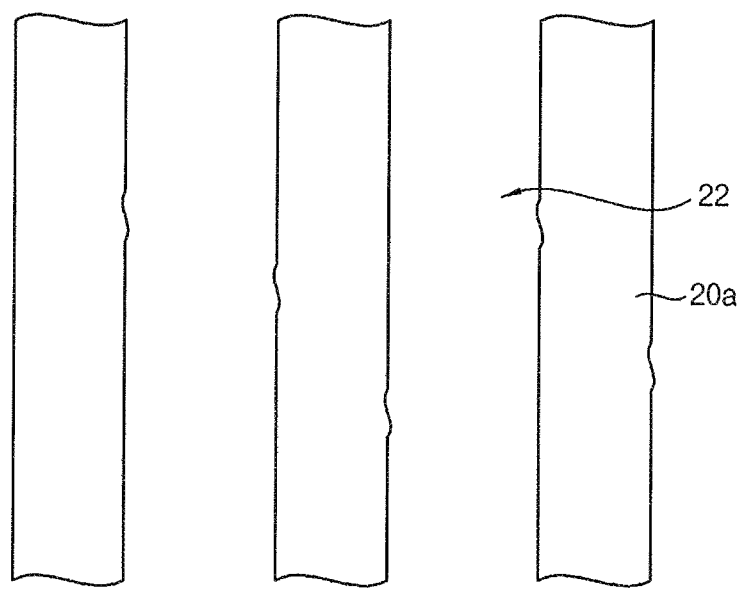
Figure 10:
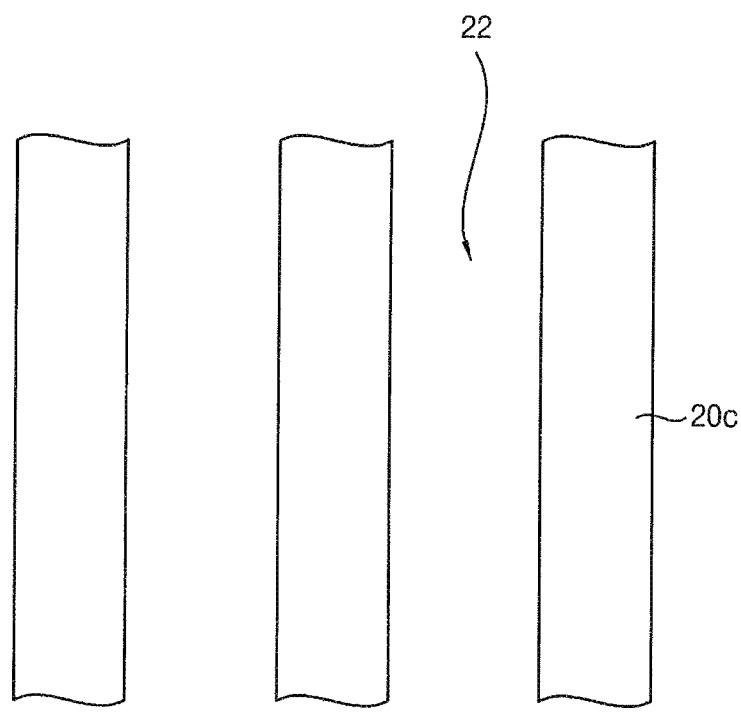

FIGS. 1 to 8 are cross-sectional views and plan views illustrating example embodiments of stages of a method of forming patterns in accordance with principles of inventive concepts. FIGS. 9 and 10 are plan views illustrating additional example embodiments of stages of a method of forming patterns in accordance with principles of inventive concepts.

Figure 1:
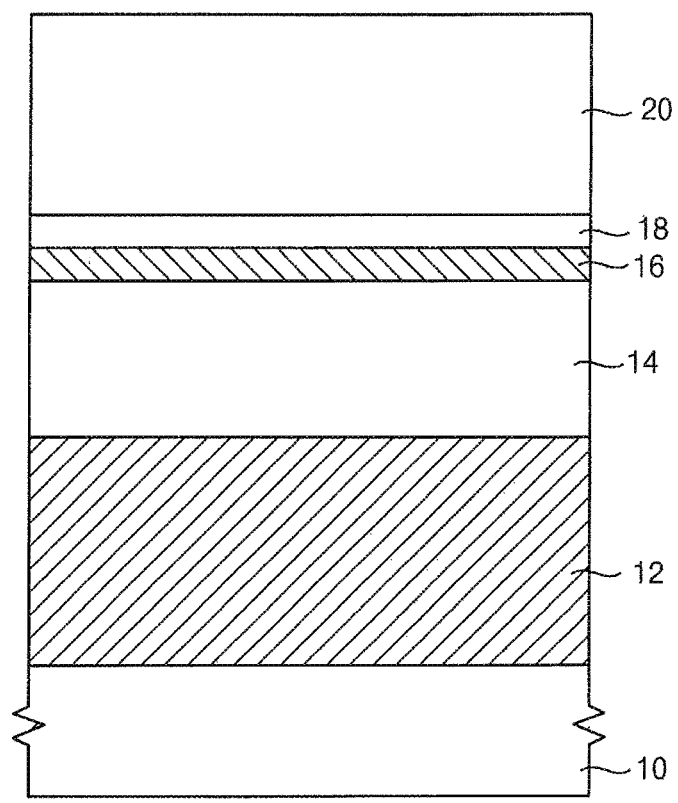
FIGS. 1 to 23 represent non-limiting, example embodiments as described herein.
Figure 2:
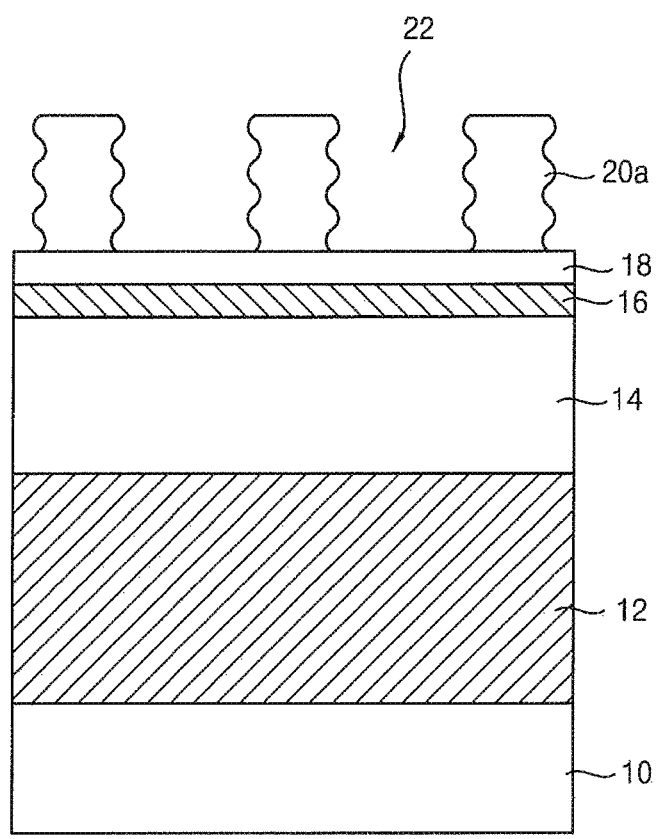
Figure 3:
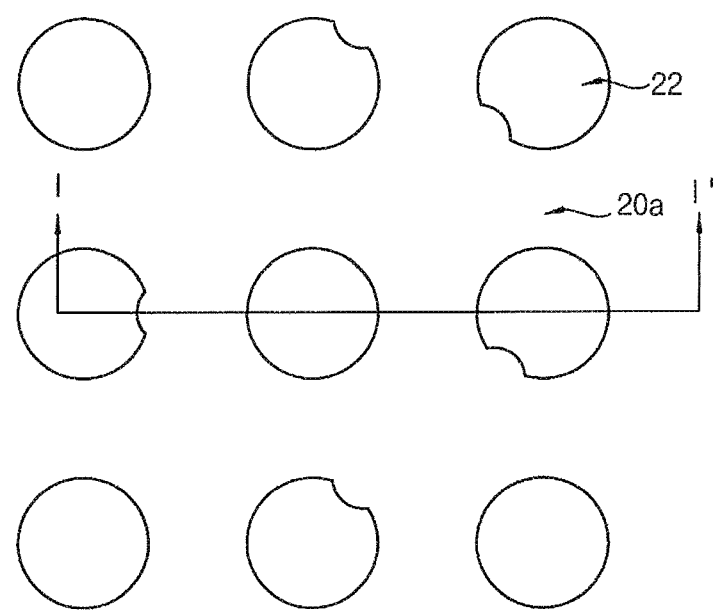
Figure 4:
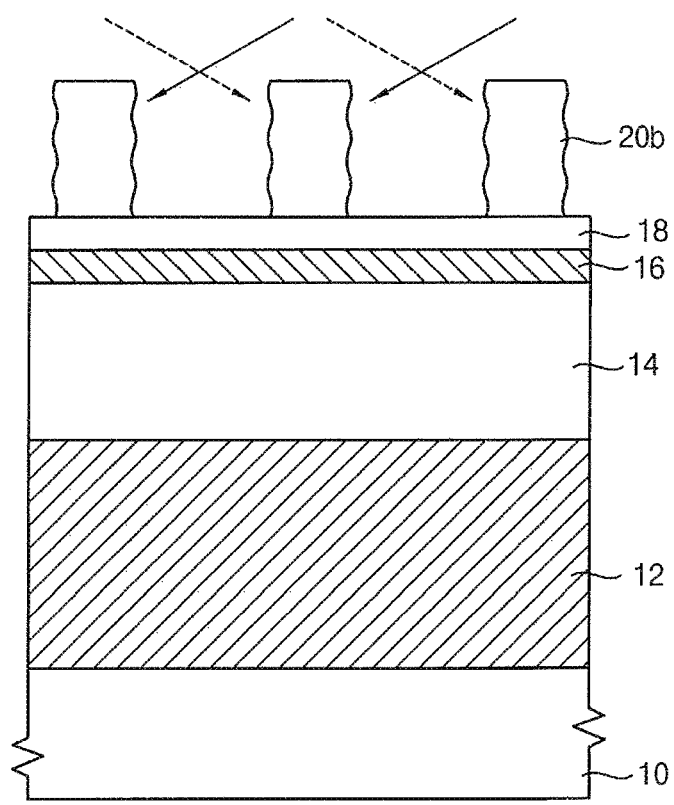
Figure 5:
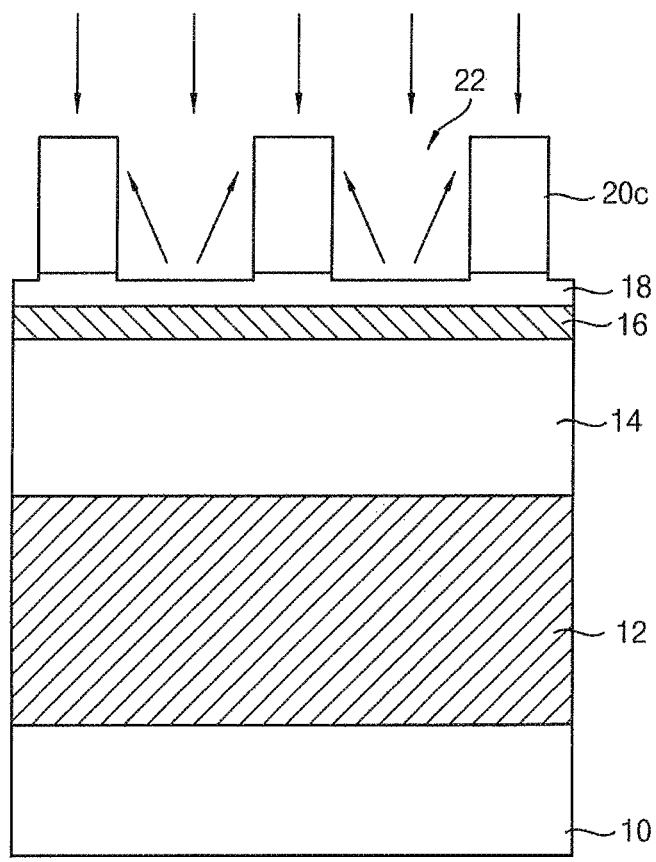
Figure 6:
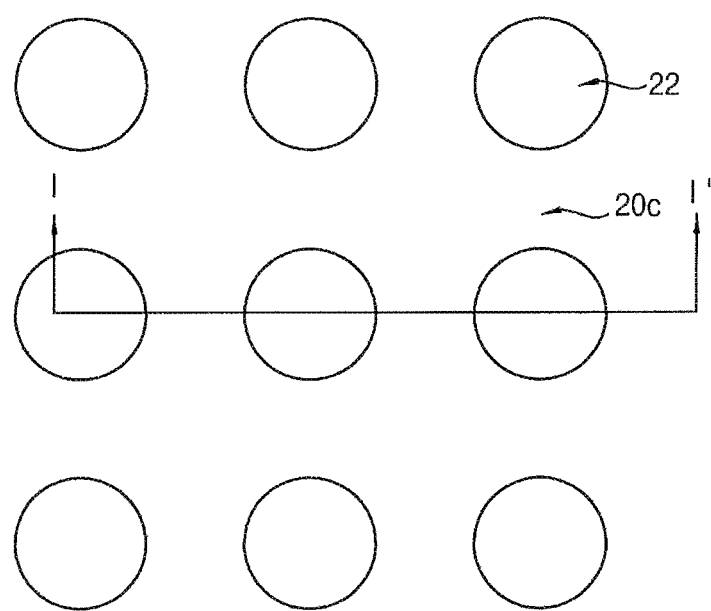

FIGS. 1, 2, 4, 5, 7 and 8 are cross-sectional views, and FIGS. 3 and 6 are plan views.

A method of forming a pattern structure including a plurality of contact holes is illustrated with reference to FIGS. 1 to 8, and a method of forming a pattern structure including lines and spaces is illustrated with reference to FIGS. 9 and 10.

Referring to FIG. 1, an etch target layer 12 may be formed on a substrate 10. Alternatively, if the substrate 10 itself is etched, that is, if the substrate 10 is itself and etch target, the etch target layer 12 may not be formed on the substrate 10. In example embodiments, patterns and insulating interlayers may be further formed between the substrate 10 and the etch target layer 12.

A plurality of mask layers may be formed on the etch target layer 12. The mask layers may include a proper material for serving as an etching mask, when the etch target layer 12 is etched. That is, as is known in the art, the mask layers may include appropriate materials according to the material, or composition, of the etch target layer 12.

In example embodiments, the mask layers may include at least two stacked layers. For example, the mask layers may have a stacked structure including a spin-on hard mask (SOH) layer 14 and a silicon oxynitride layer 16.

In example embodiments, an anti-reflective coating (ARC) layer 18 may be formed on the silicon oxynitride layer 16 and a photoresist layer 20 may be formed on the ARC layer 18.

Referring to FIG. 2, the photoresist layer 20 may be exposed and developed to form a first preliminary photoresist pattern 20a. As is known in the art, a reticle may be employed in conjunction with the exposure process to form the shape of the first preliminary photoresist pattern 20a. Irregularities in the pattern 20a, shown as a wavy pattern in sidewalls of pattern 20a, may be exaggerated for illustrative purposes.

In example embodiments, as shown in FIG. 3, the first preliminary photoresist pattern 20a may include a plurality of contact holes 22 regularly arranged in an array. Hereinafter, example embodiments in which a first preliminary photoresist pattern 20a includes contact holes may be the primary focus of description. However, in some example embodiments, as shown in FIG. 9, the first preliminary photoresist pattern 20a may have a liner shape.

A portion of the ARC layer 18 may be exposed by the first preliminary photoresist pattern 20a.

As previously noted, a sidewall of the first preliminary photoresist pattern 20a may have a poor roughness property. For example, the sidewall of the first preliminary photoresist pattern 20a may have curved portions, the geometrical properties of which may be a function of the frequency of light, or electromagnetic energy, used in the exposure process. The curved portions may be formed due to the frequency of an exposure light in the exposure process. The first preliminary photoresist pattern 20a may exhibit poor uniformity due to curved portions, which are, in turn, related to the wavelength of light used in the exposure process.

Nonuniformities in photoresist pattern 20a related to limitations of the light used for exposure (also related to minimum feature size and/or depth of focus), may be in the form of non-uniform widths or shapes in contact hole embodiments, or non-uniform line widths in line pattern embodiments.

Referring to FIG. 4, in example embodiments in accordance with principles of inventive concepts, a first ion beam etching process may be performed on the first preliminary photoresist pattern 20a, to thereby form a second preliminary photoresist pattern 20b.

In the first ion beam etching process, the ion beam may be incident on an upper surface of the substrate 10 at a first incident angle. The first incident angle may be in a range of from about 20 degrees to about 50 degrees. By employing a first ion beam etching process in accordance with principles of inventive concepts, the curved portion of the first preliminary photoresist pattern 20a may be partially etched to form the second preliminary photoresist pattern 20b having a relatively good roughness property. That is, the second preliminary photoresist pattern 20b may have a roughness property different from (that is, it may be smoother than) the roughness property of the first preliminary photoresist pattern 20a.

In example embodiments in accordance with principles of inventive concepts inert gas, such as argon (Ar), xenon (Xe), neon (Ne), etc., may be used in the first ion beam etching process.

In the first ion beam etching process, the first preliminary photoresist pattern 20a may maintain a desired overall structure thereof, with only a profile of the sidewalls of the first preliminary photoresist pattern 20a changed. In example embodiments, a voltage used in the first ion beam etching process may be lower than a voltage used in an ion beam etching process for the etch target layer 12. In example embodiments, the first ion beam etching process may be performed using a voltage in a range of from about 50V to about 500V.

Referring to FIG. 5, in example embodiments in accordance with principles of inventive concepts, a second ion beam etching process may be performed on a photoresist pattern, this time on the second preliminary photoresist pattern 20b, so that a photoresist pattern 20c may be formed.

In the second ion beam etching process, the ion beam may be incident on the upper surface of the substrate 10 at a second incident angle that is greater than the first incident angle (that is, the incident angle associated with the first ion beam etching of preliminary photoresist pattern 20a). In example embodiments, the second incident angle may be in a range of from about 70 degrees to about 90 degrees.

In example embodiments in accordance with principles of inventive concepts, during the second ion beam etching process, the ARC layer 18 exposed by the second preliminary photoresist pattern 20b may be etched and elements of the etched ARC layer may be re-deposited on a sidewall of the second preliminary photoresist pattern 20b. The re-deposited ARC layer 18 may fill an inner space of the curved portion of the sidewall of the second preliminary photoresist pattern 20b (that is, may fill in concavities in the sidewall). Thus, as shown in FIG. 6 and/or FIG. 10, a sidewall of the photoresist pattern 20c may have a roughness property better than the roughness property of the sidewall of the second preliminary photoresist pattern 20b.

In example embodiments in accordance with principles of inventive concepts, inert gas, such as argon (Ar), xenon (Xe), neon (Ne), etc., may be used in the second ion beam etching process.

Similar to the first ion beam etching process, the voltage used in the second ion beam etching process may be lower than the voltage used in an ion beam etching process for the etch target layer 12. In example embodiments in accordance with principles of inventive concepts, the second ion beam etching process may be performed using a voltage in a range of from about 50V to about 500V.

In example embodiments in accordance with principles of inventive concepts, the first and second ion beam etching processes just described may be performed in-situ.

In some example embodiments, a sequence of the first and second ion beam etching processes may be changed. That is, the second ion beam etching process, using the first incident angle, is performed on the first preliminary photoresist pattern 20a, and then the first ion beam etching process, using the first incident angle, may be performed to form the photoresist pattern.

Figure 7:
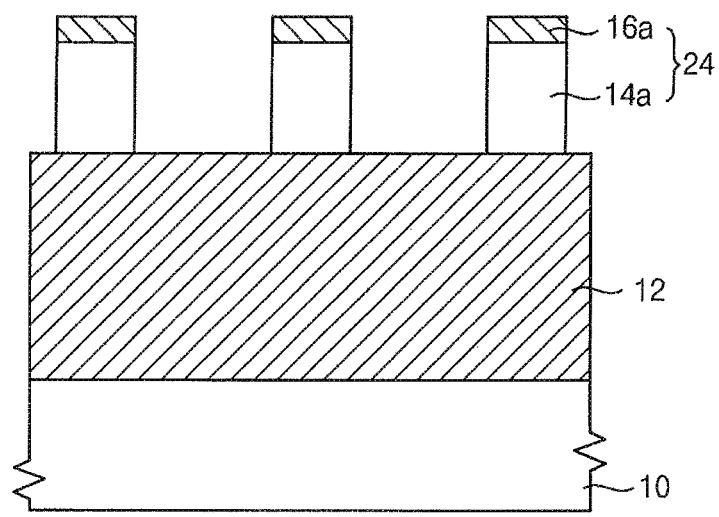

Referring to FIG. 7, the ARC layer 18, the silicon oxynitride layer 16 and the spin-on hard mask (SOH) layer 14 may be anisotropically etched using the photoresist pattern 20c as an etching mask. In this manner, a mask structure 24 including a spin-on hard mask (SOH) 14a and a silicon oxynitride pattern 16a sequentially stacked may be formed on the etch target layer 12. During the anisotropic etching process, the photoresist pattern 20c and the ARC layer 18 may be removed.

The anisotropic etching process may include an ion beam etching process or a reactive ion etching process, for example.

Figure 8:
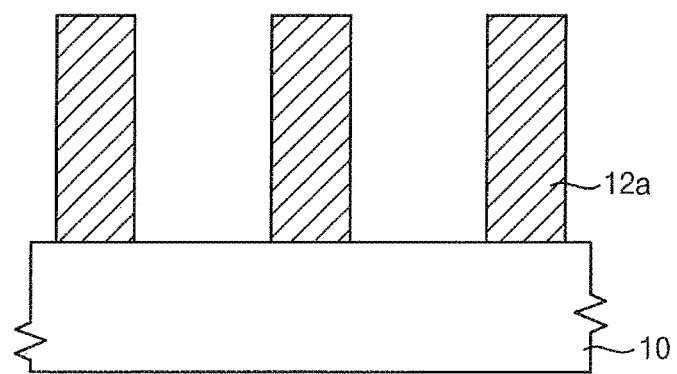

Referring to FIG. 8, the etch target layer 12 may be anisotropically etched using the mask structure 24 as an etching mask to form a pattern structure 12a. In example embodiments, depending on the shape of the etching mask, the pattern structure 12a may include a plurality of contact holes 30. In some example embodiments, depending on the shape of the etching mask, the pattern structure 12a may include lines and spaces alternatively arranged. The anisotropic etching process may include an ion beam etching process or a reactive ion etching process, for example.

Because ion beam etching in accordance with principles of inventive concepts may smooth sidewalls of preliminary photoresist patterns to form smooth-walled mask structures 24, characteristics, such as the widths, shapes, and sidewalls, of patterns structures 12a, which may be implemented as contact holes 30 or line patterns, may be significantly improved and exhibit uniform, smooth profiles.

FIGS. 11 to 15 are cross-sectional views illustrating stages of an example embodiment of a method of forming patterns in accordance with principles of inventive concepts.

Figure 11:
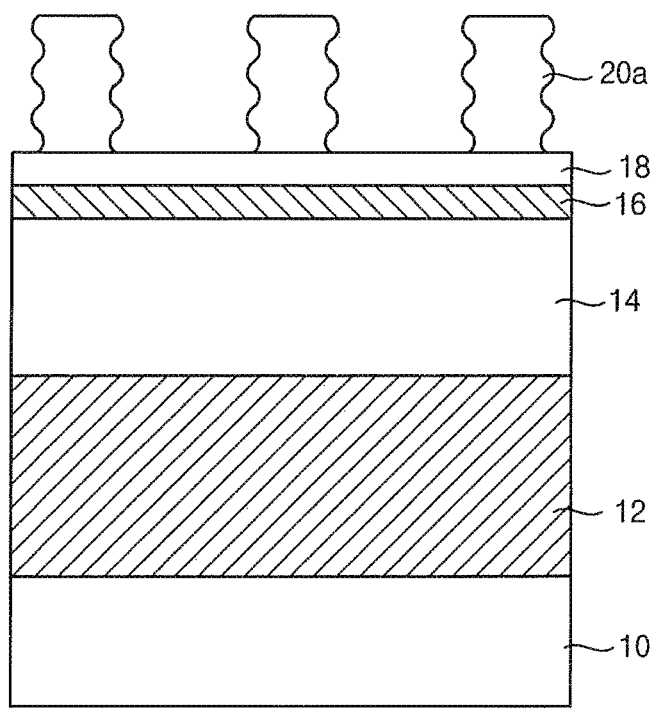

Referring to FIG. 11, processes illustrated with reference to FIGS. 1 and 2 may be performed, so that the first preliminary photoresist pattern 20a may be formed on the ARC layer 18.

In example embodiments, after forming the first preliminary photoresist pattern 20a, either one or none of the first and second ion beam etching processes previously described may be performed on the first preliminary photoresist pattern 20a.

Figure 12:
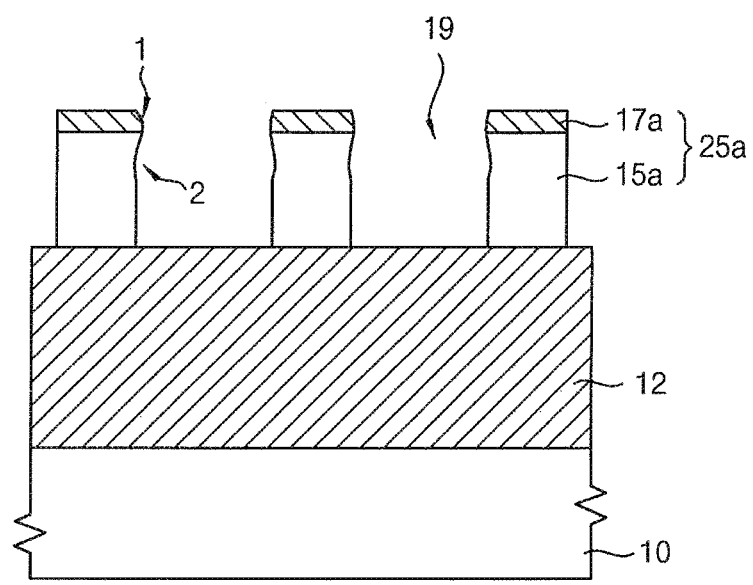

Referring to FIG. 12, the ARC layer 18, the silicon oxynitride layer 16 and the SOH layer 14 may be anisotropically etched using the first preliminary photoresist pattern 20a as an etching mask. In this manner, a first preliminary mask structure 25a including a SOH 15a and a silicon oxynitride pattern 17a sequentially stacked may be formed on the etch target layer 12. During the anisotropic etching process, the first preliminary photoresist pattern 20a and the ARC layer 18 may be removed. In example embodiments, the first preliminary mask structure 25a may include a plurality of contact holes 19. A portion of the etch target layer 12 may be exposed by the first preliminary mask structure 25a.

The anisotropic etching process may include an ion beam etching process or a reactive ion etching process, for example.

In some example embodiments, some of the contact holes 19 may have an upper width less than a lower width thereof. That is, some of the contact holes 19 may include an upper portion having a relatively small width and may be characterized by a necking portion 1 of which a sidewall may protrude in a horizontal direction. Some of the contact holes 19 may include a lower portion having a relatively wide width and may be characterized by a bowing portion 2 where a sidewall may be recessed.

Figure 13:
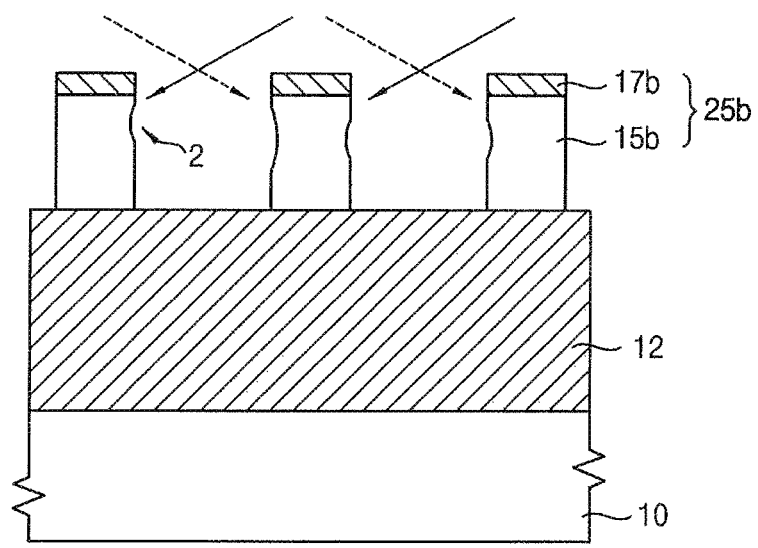

Referring to FIG. 13, in example embodiments, a first ion beam etching process, such as previously described, may be performed on the first preliminary mask structure 25a to form a second preliminary mask structure 25b.

The first ion beam etching process illustrated with reference to FIG. 13 may be substantially the same as the first ion beam etching process illustrated with reference to FIG. 4. That is, in the first ion beam etching process, the ion beam may be incident on the upper surface of the substrate 10 at the first incident angle in a range of from about 20 degrees to about 50 degrees.

Figure 14:
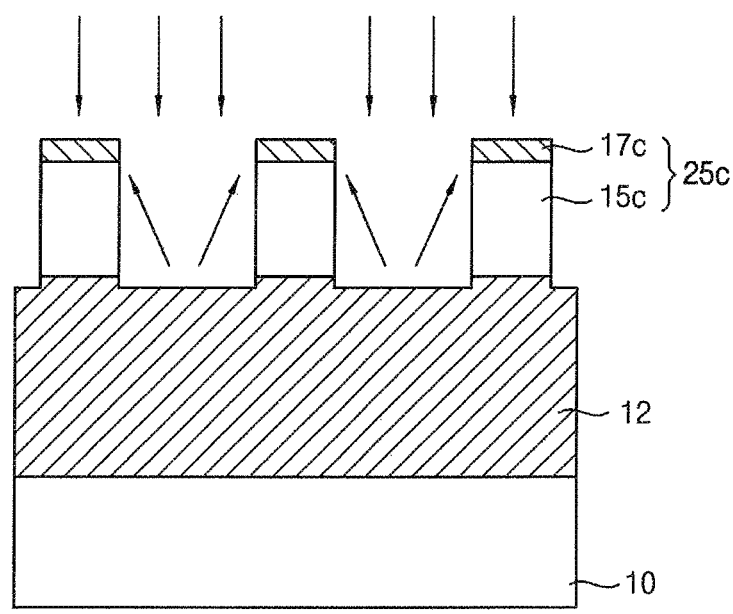

In accordance with principles of inventive concepts, a first ion beam etching process may reduce the roughness of the first preliminary mask structure 25a, removing the necking portion 1, to produce the improved, smoother, second preliminary mask structure 25b. Referring to FIG. 14, the second ion beam etching process may be performed on the second preliminary mask structure 25b, so that a mask structure 25c may be formed.

The second ion beam etching process illustrated with reference to FIG. 14 may be substantially the same as the second ion beam etching process illustrated with reference to FIG. 5. That is, in the second ion beam etching process, the ion beam may be incident on the surface of the substrate 10 at the second incident angle in a range from about 70 degrees to about 90 degrees.

During the second ion beam etching process, a surface of the etch target layer 12 exposed by the second preliminary mask structure 25b may be partially etched, and elements of the etched etch target layer 12 may be re-deposited to fill the bowing portion 2 of a sidewall of the second preliminary mask structure 25b. In this manner, a sidewall of the mask structure 25c may have a roughness property better than a roughness property of a sidewall of the second preliminary mask structure 25b, and may have a substantially vertical slope.

In example embodiments in accordance with principles of inventive concepts, the first and second ion beam etching processes may be performed in-situ.

In some example embodiments, a sequence of the first and second ion beam etching processes may be changed. That is, the second ion beam etching process, using the first incident angle, may be performed on the first preliminary mask structure 25a, and then the first ion beam etching process, using the first incident angle, may be performed to form the photoresist pattern.

Figure 15:
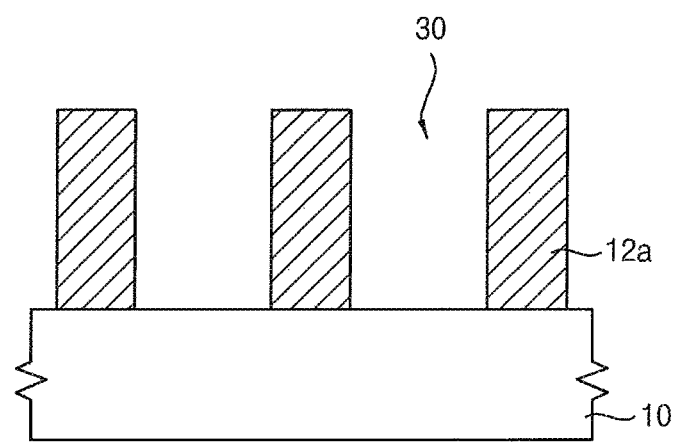

Referring to FIG. 15, the etch target layer 12 may be anisotropically etched using the mask structure 25c as an etching mask to form a pattern structure 12a. In example embodiments, depending on the shape of the etching mask, the pattern structure 12a may include a plurality of contact holes 30. In some example embodiments, depending on the shape of the etching mask, the pattern structure 12a may include line patterns and spaces alternatively arranged. The anisotropic etching process may include an ion beam etching process or a reactive ion etching process, for example.

Because ion beam etching in accordance with principles of inventive concepts may smooth sidewalls of preliminary photoresist patterns (removing necking or bowing portions, for example) to form smooth-walled mask structures 24, characteristics, such as the widths, shapes, and sidewalls, of patterns structures 12a, which may be implemented as contact holes 30 or line patterns, may be significantly improved and exhibit uniform, smooth profiles.

FIGS. 16 to 23 are cross-sectional views illustrating example stages of a method of manufacturing a magnetoresistive random access memory (MRAM) device in accordance with principles of inventive concepts.

In example embodiments, a magnetic tunnel junction (MTJ) structure in the MRAM device may be formed by at least one of the methods of forming pattern structure in accordance with principles of inventive concepts, as described above.

Figure 16:
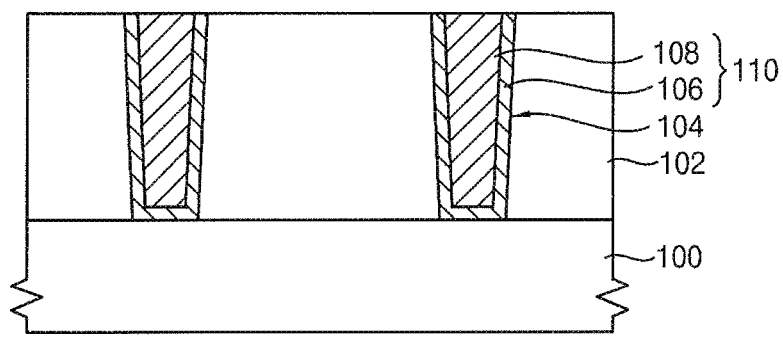

Referring to FIG. 16, a first insulating interlayer 102 may be formed on a substrate 100. A lower electrode contact 110 may be formed through the first insulating interlayer 102.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Various types of elements (not shown), e.g., word lines, transistors, diodes, source/drain regions, source lines, contact plugs, wirings, etc., and an insulating interlayer (not shown) covering the elements may be further formed on the substrate 100.

In example embodiments, an etching mask (not shown) may be formed on the first insulating interlayer 102. The first insulating interlayer 102 may be etched by a dry etching process using the etching mask to form a first opening 104 exposing an upper surface of the substrate 100. The dry etching process may include a chemical etching process, e.g., a reactive ion etching (RIE) process, for example.

A first barrier layer may be formed on the exposed upper surface of the substrate 100, a sidewall of the first opening 104, and the first insulating interlayer 102. A first conductive layer may be formed on the first barrier layer to fill the first opening 104. In example embodiments, the first barrier layer and the first conductive layer may be formed by a chemical vapor deposition (CVD) process or an atomic layer deposition (ALD) process, for example. The first barrier layer may be formed of a metal, e.g., tantalum, titanium, etc, and/or a metal nitride, e.g., tungsten nitride, tantalum nitride, titanium nitride, etc. The first conductive layer may be formed of a metal having a low resistance, e.g., tungsten, copper, aluminum, etc.

The first barrier layer and the first conductive layer may be planarized until an upper surface of the first insulating interlayer 102 may be exposed. In this manner, the lower electrode contact 110 including a first barrier pattern 106 and a conductive pattern 108 may be formed to fill the first opening 104.

Figure 17:
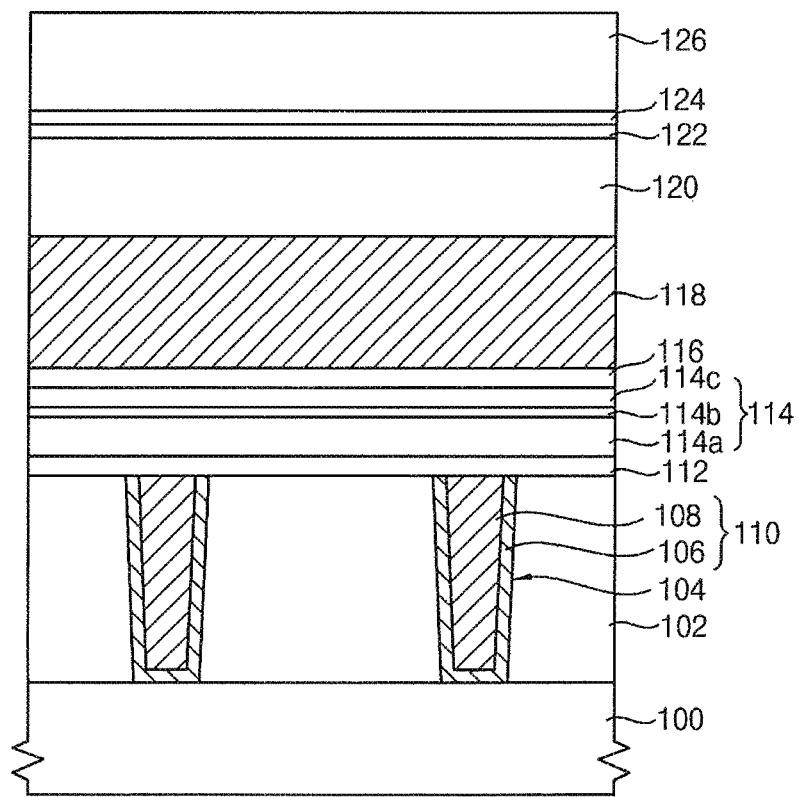

Referring to FIG. 17, a lower electrode layer 112, an MTJ layer 114, and a middle electrode layer 116 may be sequentially formed on the first insulating interlayer 102 and the lower electrode contact 110. An etch target layer 118, a SOH layer 120 and a silicon oxynitride layer 122 may be sequentially formed on the middle electrode layer 116. An ARC layer 124 and a photoresist layer 126 may be sequentially formed on the silicon oxynitride layer 122.

The lower electrode layer 112 may be formed of a metal, e.g., tantalum, titanium, etc., and/or a metal nitride, e.g., tantalum nitride, titanium nitride, etc.

The MTJ layer 114 may have a stacked structure including a first magnetic layer 114a, a tunnel barrier layer 114b and a second magnetic layer 114c, sequentially stacked. In example embodiments, the first magnetic layer 114a may include a fixed layer, a lower ferromagnetic layer, an antiferromagnetic coupling spacer layer and an upper ferromagnetic layer. In example embodiments, the second magnetic layer 114c may serve as a free layer having a changeable magnetization direction. The tunnel barrier layer 114b may be disposed between the first and second magnetic layers 114a and 114c. As a result, the first and second magnetic layers 114a and 114c may not be directly contact each other. In example embodiments, the tunnel barrier layer 114b may include an insulating metal oxide.

The middle electrode layer 116 may be formed of a metal, e.g., tantalum, titanium, etc., and/or a metal nitride, e.g., tantalum nitride, titanium nitride, etc.

The etch target layer 118 may include a metal. In example embodiments, the etch target layer 118 may include, e.g., tungsten, copper, platinum, nickel, silver, gold, aluminum, etc. The etch target layer 118 may serve as an upper electrode through subsequent processes.

The SOH layer 120, the silicon oxynitride layer 122, the ARC layer 124 and the photoresist layer 126 formed on the etch target layer 118 may be substantially the same as or similar to those illustrated with reference to FIG. 1, (that is, SOH 14, silicon oxynitride layer 16, ARC layer 18, and photoresist layer 20, respectively).

Figure 18:
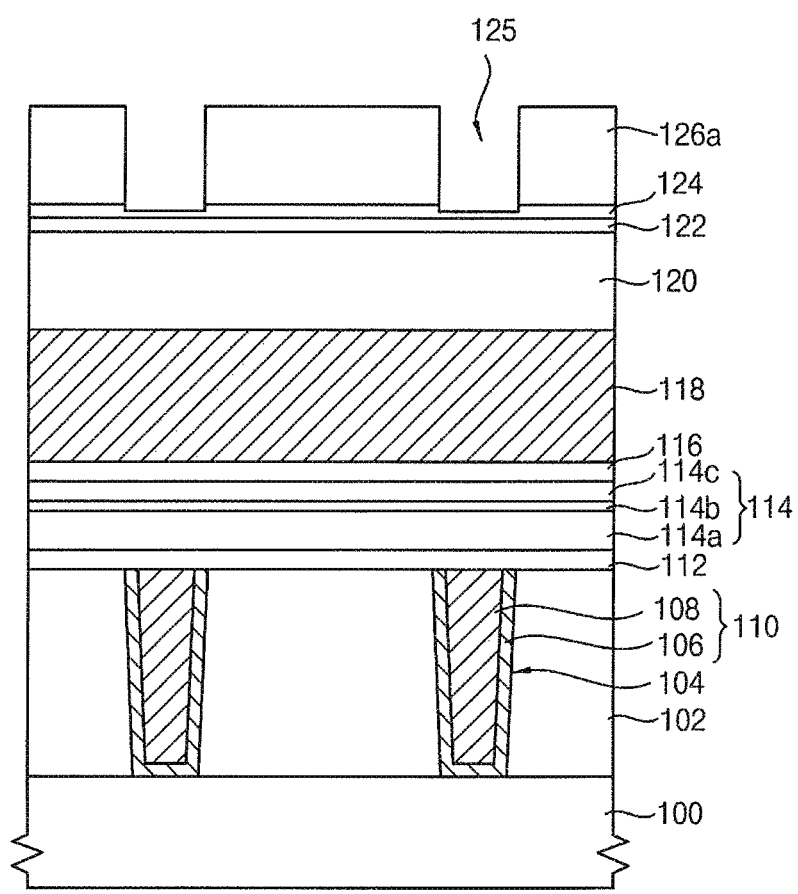

Referring to FIG. 18, an exposure process and a developing process may be performed on the photoresist layer 126, so that a first preliminary photoresist pattern may be formed. A first ion beam etching process may be performed on the first preliminary photoresist pattern, so that a second preliminary photoresist pattern may be formed. A second ion beam etching process may be performed on the second preliminary photoresist pattern, so that a photoresist pattern 126a may be formed. In example embodiments, the photoresist pattern 126a may include a plurality of contact holes 125 overlapping the lower electrode contacts 110, respectively.

Processes for forming the photoresist pattern 126a, e.g., the first and second ion beam etching processes may be substantially the same as or similar to those illustrated and discussed with reference to FIGS. 2 to 4. By employing such processes in accordance with principles of inventive concepts, sidewalls of the contact holes 125 included in the photoresist pattern 126a may have a good roughness property (that is, they may be relatively smooth when compared to a photoresist pattern prior to ion beam etching).

Figure 19:
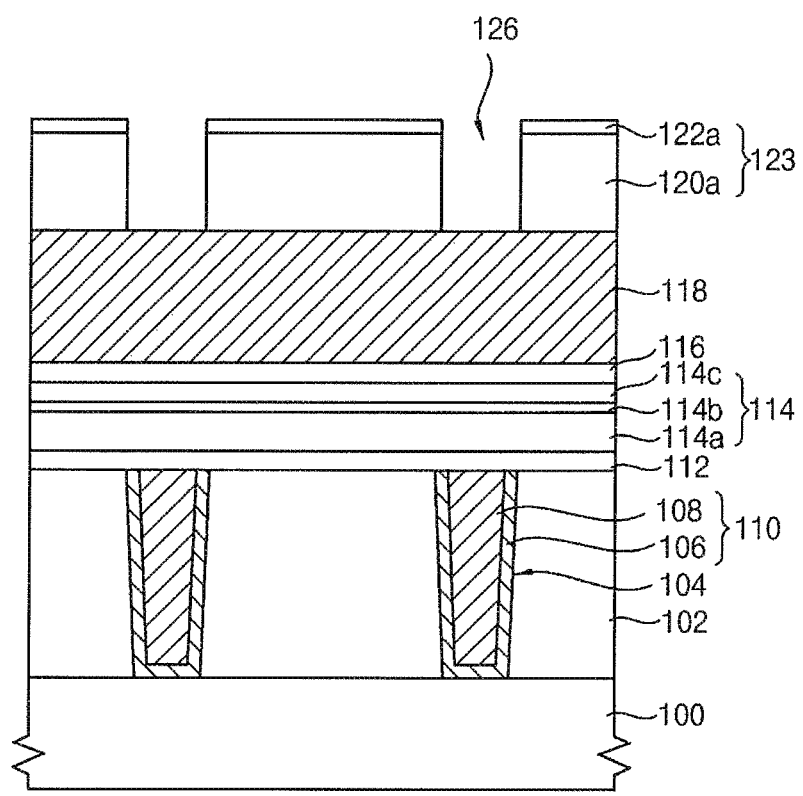

Referring to FIG. 19, the ARC layer 124, the silicon oxynitride layer 122 and the SOH layer 120 may be anisotropically etched using the photoresist pattern 126a as an etching mask. In this manner, a mask structure 123 including a SOH 120a and a silicon oxynitride pattern 122a sequentially stacked may be formed. During the anisotropic etching process, the photoresist pattern 126a and the ARC layer 124 may be removed.

The mask structure 123 may include a plurality of contact holes 127 and a surface of the etch target layer 118 may be exposed by the mask structure 123.

In some example embodiments, after forming the mask structure 123, the first ion beam etching process and/or the second ion beam etching process may be further performed (that is, repeated), as illustrated with reference to FIGS. 13 and 14.

Figure 20:
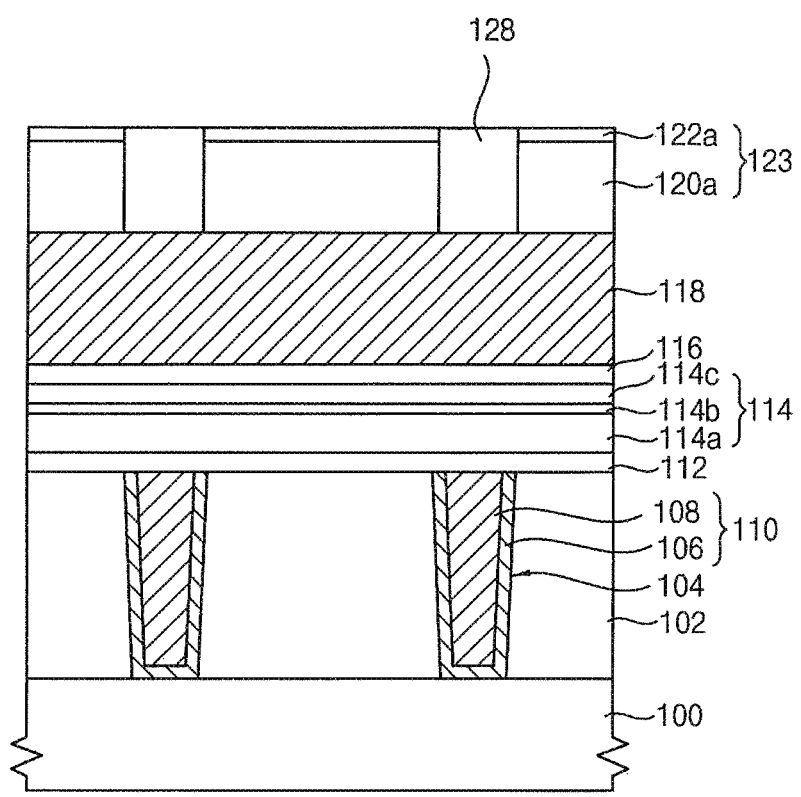

Referring to FIG. 20, a hard mask layer may be formed to fill the contact holes 127. The hard mask layer may be formed of silicon oxide or silicon nitride. The hard mask layer may be formed by a CVD process or an ALD process.

The hard mask layer may be planarized until an upper surface of the silicon oxynitride pattern 122a may be exposed. The planarization process may include an etch-back process or a chemical mechanical polishing (CMP) process, for example. In this manner, a hard mask 128 having a pillar shape may be formed to fill each of the contact holes 127.

Figure 21:
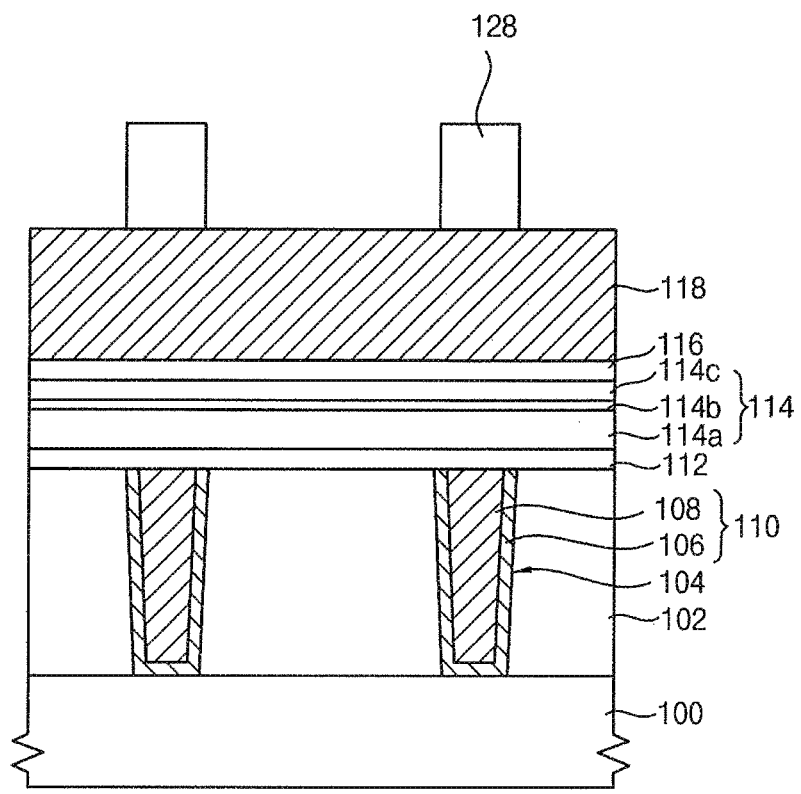

Referring to FIG. 21, the mask structure 123 may be removed. In this manner, the hard mask 128 may remain on the etch target layer 118. Sidewalls of contact holes 127 included in the mask structure 123 may exhibit smoothness, that is, may have the good roughness property, resulting from processes in accordance with principles of inventive concepts, so that widths and shapes of the hard masks 128 may be uniform.

Figure 22:
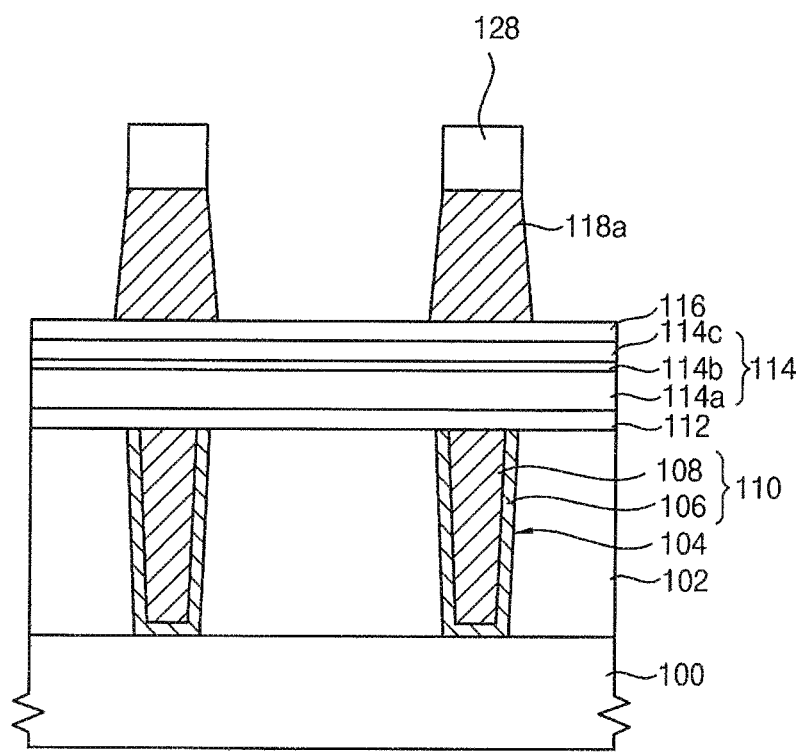

Referring to FIG. 22, the etch target layer 118 may be anisotropically etched using the hard mask 128 as an etching mask. The anisotropic etching process may include an ion beam etching process or a reactive ion beam etching process.

A voltage used in the etching process for the etch target layer 118 may be greater than voltage used in each of the first and second ion beam etching processes.

When the etch target layer 118 includes a metal, the etch target layer 118 may be etched by an ion beam etching process.

The etch target layer 118 may be formed to form a pattern structure 118a, which may have a pillar shape and may serve as an upper electrode. During the etching process, an upper portion of the hard mask 128 may be partially etched.

Figure 23:
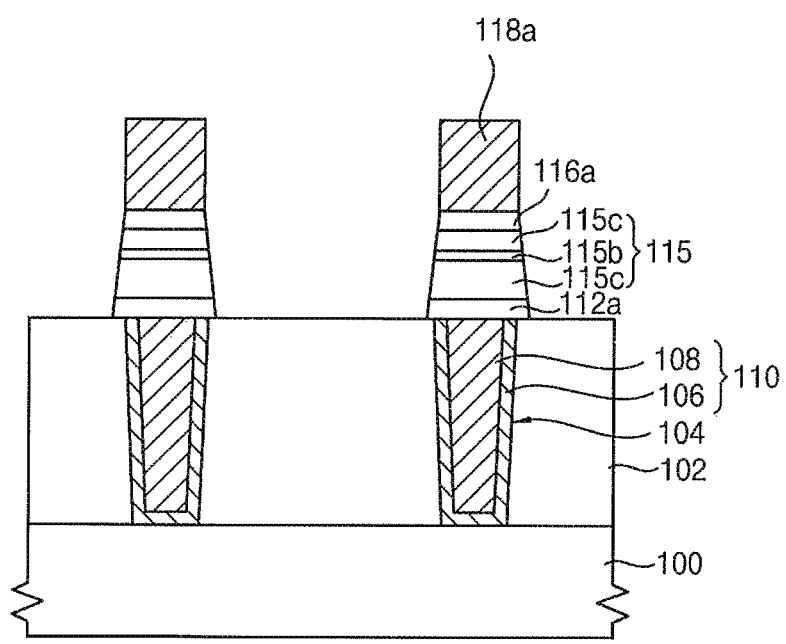

Referring to FIG. 23, the middle electrode layer 116, the MTJ layer 114 and the lower electrode layer 112 may be sequentially etched using the hard mask 128 and the underlying pattern structure 118a as an etching mask to form a lower electrode 112a, an MTJ structure 115 and a middle electrode 116a on the lower electrode contact 110. A stacked structure including the lower electrode 112a, the MTJ structure 115 and the middle electrode 116a may have a pillar shape. The MTJ structure 115 may include a first magnetic pattern 115a, a tunnel barrier pattern 115b and a second magnetic pattern 115c sequentially stacked.

In example embodiments, the etching process may include a physical etching process, e.g., an ion beam etching process.

During the etching process, the hard mask 128 may be removed and an upper portion of the pattern structure 118a may be removed. Additionally, in the etching process, an upper portion of the first insulating interlayer 102 may be etched.

As a result of etching processes in accordance with principles of inventive concepts, the width and a shape of the hard mask 128 may be uniform, so that the width and a shape of the MTJ structure 115 may be uniform As described above, an MRAM device may be manufactured.

In example embodiments in accordance with principles of inventive concepts, processes such as ion beam etching may allow pattern structures having minute widths to be formed. Particularly, patterns and contacts in a highly integrated semiconductor device may be formed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a pattern of a semiconductor device, comprising:
   sequentially forming a first mask layer and an anti-reflective coating layer on a substrate;
   forming a photoresist layer on the anti-reflective coating layer;
   exposing and developing the photoresist layer to form a first preliminary photoresist pattern;
   performing a first ion beam etching process on the first preliminary photoresist pattern to form a second preliminary photoresist pattern, wherein an ion beam in the first ion beam etching process is incident on an upper surface of the substrate at a first incident angle;
   performing a second ion beam etching process on the second preliminary photoresist pattern to form a photoresist pattern, wherein an ion beam in the second ion beam etching process is incident on the upper surface of the substrate at a second incident angle greater than the first incident angle; and
   etching the anti-reflective coating layer and the first mask layer using the photoresist pattern as an etching mask to form a mask structure.

2. The method of claim 1, wherein a sidewall of the first preliminary photoresist pattern is partially etched during the first ion beam etching process, so that a sidewall of the second preliminary photoresist pattern has a roughness property different from a roughness property of the sidewall of the first preliminary photoresist pattern.

3. The method of claim 1, wherein a surface of the anti-reflective coating layer is partially etched, and elements of the etched anti-reflective coating layer are re-deposited on a sidewall of the second preliminary photoresist pattern, during the second ion beam etching process.

4. The method of claim 1, wherein the first and second ion beam etching processes are performed using a voltage in a range of from about 50V to about 500V.

5. The method of claim 1, wherein the first and second ion beam etching processes are performed using an inert gas including argon (Ar), xenon (Xe) or neon (Ne).

6. The method of claim 1, wherein the first incident angle is in a range of from about 20 degrees to about 50 degrees.

7. The method of claim 1, wherein the second incident angle is in a range of from about 70 degrees to about 90 degrees.

8. The method of claim 1, further comprising:
forming an etch target layer between the substrate and the first mask layer prior to sequentially faulting the first mask layer and the anti-reflective coating layer on the substrate; and
after forming the mask structure, etching the etch target layer using the mask structure as an etching mask to form a pattern structure.

9. The method of claim 1, further comprising, after forming the mask structure:
performing a third ion beam etching process on the mask structure to form a first mask structure, wherein an ion beam in the third ion beam etching process is incident on the upper surface of the substrate at a third incident angle; and
performing a fourth ion beam etching process on the first mask structure to form a second mask structure, wherein an ion beam in the fourth ion beam etching process is incident on the upper surface of the substrate at a fourth incident angle greater than the third incident angle.

10. The method of claim 1, further comprising, after forming the mask structure:
forming a second mask layer to fill a gap included in the mask structure; and
planarizing the second mask layer until an upper surface of the mask structure is exposed to form a second mask.

11. The method of claim 10, further comprising:
forming an etch target layer between the substrate and the first mask layer prior to sequentially forming the first mask layer and the anti-reflective coating layer on the substrate; and
after forming the second mask, etching the etch target layer using the second mask as an etching mask to form a pattern structure.

12. A method of forming a pattern of a semiconductor device, comprising:
sequentially forming an etch target layer and a first mask layer on a substrate;
forming a first photoresist pattern on the first mask layer;
etching the first mask layer using the first photoresist pattern as an etching mask to form a first preliminary mask pattern;
performing a first ion beam etching process on the first preliminary mask pattern to form a second preliminary mask pattern, wherein an ion beam in the first ion beam etching process is incident on an upper surface of the substrate at a first incident angle;
performing a second ion beam etching process on the second preliminary mask pattern to form a first mask, wherein an ion beam in the second ion beam etching process is incident on the upper surface of the substrate at a second incident angle greater than the first incident angle; and
etching the etch target layer using the first mask as an etching mask to form a pattern structure.

13. The method of claim 12, wherein a sidewall of the first preliminary mask pattern is partially etched during the first ion beam etching process, so that a sidewall of the second preliminary mask pattern has a roughness property different from a roughness property of the sidewall of the first preliminary mask pattern.

14. The method of claim 12, wherein a surface of the etch target layer is partially etched, and elements of the etched etch target layer are re-deposited on a sidewall of the second preliminary mask pattern, during the second ion beam etching process.

15. The method of claim 12, wherein the first and second ion beam etching processes are performed using an inert gas including argon (Ar), xenon (Xe) or neon (Ne).

16. A method of manufacturing a semiconductor device, comprising:
forming an etch target layer including a magnetic tunnel junction layer on a substrate;
sequentially forming a first mask layer and an anti-reflective coating layer on the etch target layer;
forming a first preliminary photoresist pattern on the anti-reflective coating layer, the first preliminary photoresist pattern including a plurality of contact holes;
performing a first ion beam etching process, using an ion beam incident at a first incident angle less than ninety degrees with an upper surface of the substrate, on the first preliminary photoresist pattern to form a second preliminary photoresist pattern, wherein the ion beam etching process smoothes sidewalls of contact holes; and
performing a second ion beam etching process, using an ion beam incident at a second incident angle greater than the first incident angle, on the second preliminary photoresist pattern to form a photoresist pattern.

17. The method of claim 16, further comprising; performing a third ion beam etching process on the photoresist pattern, wherein an ion beam in the third ion beam etching process is incident on the upper surface of the substrate at a third incident angle.

18. The method of claim 16, further comprising: etching the anti-reflective coating layer and the first mask layer using the photoresist pattern as an etching mask to form a mask structure.

19. The method of claim 18, further comprising:
forming a hard mask having a pillar shape to fill the contact holes in the mask structure.

20. The method of claim 19, further comprising:
etching the etch target layer using a hard mask to form a mask structure.

* * * * *